(12) United States Patent
Guo et al.

(10) Patent No.: US 10,741,794 B2
(45) Date of Patent: Aug. 11, 2020

(54) ORGANIC LIGHT EMITTING DIODE DEVICE AND MANUFACTURE METHOD THEREOF, DISPLAY PANEL

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yuanhui Guo, Beijing (CN); Yanni Liu, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 16/047,583

(22) Filed: Jul. 27, 2018

(65) Prior Publication Data

US 2019/0181382 A1    Jun. 13, 2019

(30) Foreign Application Priority Data

Dec. 11, 2017    (CN) .......................... 2017 1 1311386

(51) Int. Cl.
*H01L 51/52*    (2006.01)
*H01L 27/32*    (2006.01)
(Continued)

(52) U.S. Cl.
CPC ...... *H01L 51/5265* (2013.01); *H01L 27/3211* (2013.01); *H01L 27/3244* (2013.01);
(Continued)

(58) Field of Classification Search
CPC . H01L 51/5265; H01L 27/3244; H01L 51/56; H01L 51/5056; H01L 27/3211;
(Continued)

(56) References Cited

U.S. PATENT DOCUMENTS

2012/0183676 A1* 7/2012 Sonoda ................. C23C 14/042
427/8
2013/0001528 A1* 1/2013 Chang ................. H01L 51/0051
257/40
(Continued)

FOREIGN PATENT DOCUMENTS

JP    43351951 B2 *    7/2009 ............... B05D 5/02

*Primary Examiner* — Alexander O Williams

(57) ABSTRACT

An organic light emitting diode device and a manufacture method thereof, a display panel are provided. The organic light emitting diode device includes a plurality of pixels, each of the pixels includes at least two sub-pixels that are capable of generating light of different colors, and each of the sub-pixels includes a first electrode, a second electrode, and a light emitting layer between the first electrode and the second electrode; and each of the sub-pixels further includes a microcavity adjusting layer including pores, the microcavity adjusting layer is on a side of the first electrode that is far away from the light emitting layer, and a porosity and an average aperture of the pores in the microcavity adjusting layer of each of the sub-pixels that are capable of generating light of different colors are different.

14 Claims, 4 Drawing Sheets

(51) Int. Cl.
*H01L 51/56* (2006.01)
*H01L 51/50* (2006.01)

(52) U.S. Cl.
CPC ...... *H01L 51/5056* (2013.01); *H01L 51/5072* (2013.01); *H01L 51/5092* (2013.01); *H01L 51/5203* (2013.01); *H01L 51/5209* (2013.01); *H01L 51/5225* (2013.01); *H01L 51/56* (2013.01)

(58) Field of Classification Search
CPC ............ H01L 51/5092; H01L 51/5072; H01L 51/5203; H01L 51/5225; H01L 51/5209; H01L 51/52; H01L 27/32; H01L 51/50
USPC .......................................................... 257/40
See application file for complete search history.

(56) References Cited

U.S. PATENT DOCUMENTS

| | | | |
|---|---|---|---|
| 2014/0159018 A1* | 6/2014 | Song | H01L 51/5265 257/40 |
| 2015/0003040 A1* | 1/2015 | Bessho | F21V 9/40 362/84 |
| 2015/0069341 A1* | 3/2015 | Kim | H01L 27/3267 257/40 |
| 2015/0123885 A1* | 5/2015 | Adachi | G09G 3/3208 345/77 |
| 2016/0233274 A1* | 8/2016 | Park | H01L 27/3232 |
| 2017/0125496 A1* | 5/2017 | Oh | H01L 51/5265 |
| 2017/0363741 A1* | 12/2017 | Send | G06F 3/0304 |
| 2017/0365816 A1* | 12/2017 | He | H01L 27/32 |
| 2018/0061902 A1* | 3/2018 | Lee | H01L 51/5265 |
| 2018/0182990 A1* | 6/2018 | Youn | H01L 51/5278 |

* cited by examiner

ORGANIC LIGHT EMITTING DIODE DEVICE AND MANUFACTURE METHOD THEREOF, DISPLAY PANEL

CROSS REFERENCE

The present application claims priority to the Chinese patent application No. 2017/113,11386.8, filed on Dec. 11, 2017, the entire disclosure of which is incorporated herein by reference as part of the present application.

TECHNICAL FIELD

Embodiments of the present disclosure relate to an organic light emitting diode device and a manufacture method thereof, a display panel.

BACKGROUND

Organic light emitting diodes have advantages such as self-luminescence, wide viewing angle, wide color gamut, fast response, high luminous efficiency, low operating voltage and so on, and are widely used in fields such as display panels. In the organic light emitting diode, microcavity effect means that, where a light emitting region of the organic light emitting diode is located in a resonant cavity composed of a total reflection film and a semi-reflective film and the wavelength of light emitted from the light emitting region is of the same order of magnitude as the cavity length of the resonant cavity, the light of the wavelength is selected and strengthened.

SUMMARY

At least one embodiment of the present disclosure provides an organic light emitting diode device, the device comprises a plurality of pixels, each of the pixels comprises at least two sub-pixels that are capable of generating light of different colors, and each of the sub-pixels comprises a first electrode, a second electrode, and a light emitting layer between the first electrode and the second electrode; and each of the sub-pixels further comprises a microcavity adjusting layer comprising pores, the microcavity adjusting layer is on a side of the first electrode that is far away from the light emitting layer, and a porosity and an average aperture of the pores in the microcavity adjusting layer of each of the sub-pixels that are capable of generating light of different colors are different.

For example, in the organic light emitting diode device provided by at least one embodiment of the present disclosure, the organic light emitting diode device is a top emission type organic light emitting diode device, and the first electrode is farther away from a light emitting side of the organic light emitting diode device than the second electrode.

For example, in the organic light emitting diode device provided by at least one embodiment of the present disclosure, the first electrode is closer to the light emitting side of the organic light emitting diode device than the second electrode, and a refractive index of the microcavity adjusting layer ranges from 1.1 to 1.7.

For example, in the organic light emitting diode device provided by at least one embodiment of the present disclosure, the at least two sub-pixels that are capable of generating light of different colors comprise a first sub-pixel and a second sub-pixel, a wavelength of light emitted by the first sub-pixel is greater than a wavelength of light emitted by the second sub-pixel, and an average aperture of pores in a microcavity adjusting layer of the first sub-pixel is greater than an average aperture of pores in a microcavity adjusting layer of the second sub-pixel.

For example, in the organic light emitting diode device provided by at least one embodiment of the present disclosure, a porosity of the microcavity adjusting layer of the first sub-pixel is smaller than a porosity of the microcavity adjusting layer of the second sub-pixel.

For example, in the organic light emitting diode device provided by at least one embodiment of the present disclosure, the at least two sub-pixels that are capable of generating light of different colors comprise three sub-pixels comprising a red sub-pixel, a green sub-pixel, and a blue sub-pixel, average apertures of pores in microcavity adjusting layers of the red sub-pixel, the green sub-pixel, and the blue sub-pixel are sequentially decreased, and porosities of the microcavity adjusting layers of the red sub-pixel, the green sub-pixel, and the blue sub-pixel are sequentially increased.

For example, in the organic light emitting diode device provided by at least one embodiment of the present disclosure, the average aperture of the pores in the microcavity adjusting layer of the red sub-pixel ranges from about 700 nm to about 1000 nm; the average aperture of the pores in the microcavity adjusting layer of the green sub-pixel ranges from about 300 nm to about 700 nm; and the average aperture of the pores in the microcavity adjusting layer of the blue sub-pixel ranges from about 100 nm to about 300 nm.

For example, in the organic light emitting diode device provided by at least one embodiment of the present disclosure, a material of the microcavity adjusting layer comprises one or two selected from a group consisting of polystyrene, polymethyl methacrylate, polyvinylpyrrolidone and polyimide.

At least one embodiment of the present disclosure provides a display panel, the display panel comprises any one of the above organic light emitting diode devices.

At least one embodiment of the present disclosure provides a manufacture method of an organic light emitting diode device, the manufacture method comprises: forming a plurality of pixels, each of the pixels comprises at least two sub-pixels that are capable of generating light of different colors, and each of the sub-pixels comprises a first electrode, a second electrode, and a light emitting layer between the first electrode and the second electrode; and forming a microcavity adjusting layer on a side of the first electrode that is far away from the light emitting layer, the microcavity adjusting layer comprises pores, and a porosity and an average aperture of the pores in the microcavity adjusting layer of each of the sub-pixels that are capable of generating light of different colors are different.

For example, in the manufacture method of an organic light emitting diode device provided by at least one embodiment of the present disclosure, the at least two sub-pixels that are capable of generating light of different colors comprise a first sub-pixel and a second sub-pixel, and forming the microcavity adjusting layer comprising the pores comprises: mixing a first polymer material and a second polymer material to a solvent to form a mixture, a solubility of the first polymer material in the solvent is greater than a solubility of the second polymer material in the solvent; performing a film forming process to the mixture on a substrate to form mixture films, the film forming process comprises a first heat process; and contacting the mixture films with an extractant to form pores in the mixture films, and then performing a second heat process to evaporate the extractant, the extractant is a good solvent for the first polymer while a poor solvent for the second polymer; heating temperatures of the first heat process performed on the first sub-pixel and the second sub-pixel are different to allow the porosities and the average apertures formed in the mixture films of the first sub-pixel and the second sub-pixel to be different after the mixture films are contacted with the extractant.

For example, in the manufacture method of an organic light emitting diode device provided by at least one embodiment of the present disclosure, irradiating of infrared light is performed through a mask having different transmittances respectively corresponding to the first sub-pixel and the second sub-pixel to allow the heating temperatures of the first heat process performed on the first sub-pixel and the second sub-pixel to be different.

For example, in the manufacture method of an organic light emitting diode device provided by at least one embodiment of the present disclosure, a wavelength of light emitted by the first sub-pixel is greater than a wavelength of light emitted by the second sub-pixel, and correspondingly, the heating temperature of the first heat process performed on the first sub-pixel is lower than the heating temperature of the first heat process performed on the second sub-pixel.

For example, in the manufacture method of an organic light emitting diode device provided by at least one embodiment of the present disclosure, the at least two sub-pixels that are capable of generating light of different colors comprise three sub-pixels comprising a red sub-pixel, a green sub-pixel, and a blue sub-pixel, and heating temperatures of the first heat process performed on the red sub-pixel, the green sub-pixel, and the blue sub-pixel to form the microcavity adjusting layers are sequentially increased.

For example, in the manufacture method of an organic light emitting diode device provided by at least one embodiment of the present disclosure, the first polymer material is one selected from a group consisting of polystyrene, polymethyl methacrylate, polyvinyl pyrrolidone and polyimide, and the second polymer material is another one selected from the group consisting of the polystyrene, polymethyl methacrylate, polyvinylpyrrolidone and polyimide.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
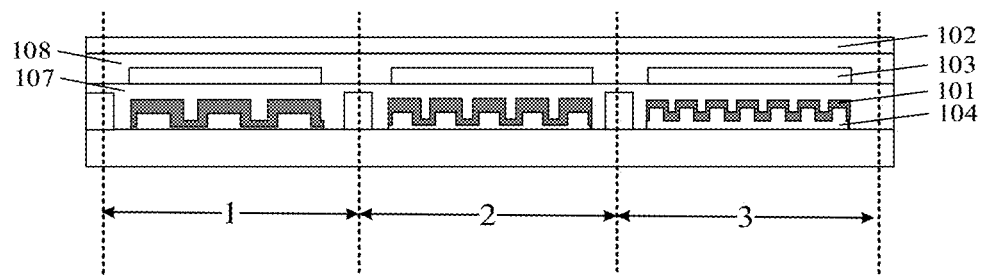
FIGS. 1A and 1B are first schematic diagrams of an organic light emitting diode device provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The microcavity effect means that, where a light emitting region of an organic light emitting diode is located in a resonant cavity composed of a total reflection film and a semi-reflective film and the wavelength of light emitted from the light emitting region is of the same order of magnitude as the cavity length of the resonant cavity, the light of the wavelength is selected and strengthened, and therefore the spectrum of the emitted light is narrowed. Inventors of the present disclosure found in research that the color saturation of an organic light emitting diode is generally low because of the microcavity effect.

At least one embodiment of the present disclosure provides an organic light emitting diode device, the device comprises a plurality of pixels, each of the pixels comprises at least two sub-pixels that are capable of generating light of different colors, and each of the sub-pixels comprises a first electrode, a second electrode, and a light emitting layer between the first electrode and the second electrode; and each of the sub-pixels further comprises a microcavity adjusting layer comprising pores, the microcavity adjusting layer is on a side of the first electrode that is far away from the light emitting layer, and a porosity and an average aperture of the pores in the microcavity adjusting layer of each of the sub-pixels that are capable of generating light of different colors are different from those of the other sub-pixel(s) of the pixel.

At least one embodiment of the present disclosure provides a display panel, the display panel comprises the above organic light emitting diode device.

At least one embodiment of the present disclosure provides a manufacture method of an organic light emitting diode device, the manufacture method comprises: forming a plurality of pixels, in which each of the pixels comprises at least two sub-pixels that are capable of generating light of different colors, and each of the sub-pixels comprises a first electrode, a second electrode, and a light emitting layer between the first electrode and the second electrode; and forming a microcavity adjusting layer on a side of the first electrode that is far away from the light emitting layer, in which the microcavity adjusting layer comprises pores, and a porosity and an average aperture of the pores in the microcavity adjusting layer of each of the sub-pixels that are capable of generating light of different colors are different from those of the other sub-pixel(s) of the pixel.

The manufacture method of an organic light emitting diode device provided by at least one embodiment of the present disclosure can manufacture an organic light emitting diode device including microcavity adjusting layers comprising pores, and the method can adjust average apertures and porosities of the pores in the microcavity adjusting layers of different sub-pixels in the organic light emitting diode device, and therefore adjust the microcavity effect generated by different sub-pixels of the organic light emitting diode device, and finally achieve the technical effect of adjusting color saturation degrees of light of different colors emitted by different sub-pixels of the organic light emitting diode device. In addition, the manufacture process of the method provided by the embodiment is simple, the cost is low, and the method is suitable for mass production.

The organic light emitting diode device, the manufacture method thereof, and the display panel of the present disclosure are described below through several specific embodiments.

At least one embodiment of the present disclosure provides a manufacture method of an organic light emitting diode device. As illustrated in FIGS. 1A-2B, the manufacture method of an organic light emitting diode device comprises: forming a plurality of pixels; each of the pixels comprises at least two sub-pixels that generate light of different colors, and each of the sub-pixels comprises a first electrode 101, a second electrode 102, and a light emitting layer 103 between the first electrode 101 and the second electrode 102. The manufacture method further comprises: forming a microcavity adjusting layer 104 on a side of the first electrode 101 that is far away from the light emitting layer 103; the microcavity adjusting layer 104 comprises pores, and a porosity and an average aperture of the pores in the microcavity adjusting layer of each of the sub-pixels that generate light of different colors are different.

For example, the organic light emitting diode comprises a first sub-pixel and a second sub-pixel. For example, the microcavity adjusting layer comprising pores can be formed on a side of the first electrode 101 or a side of the second electrode 102 that is far away from the light emitting layer 103, and the porosity and the average aperture of the pores in the microcavity adjusting layer of the first sub-pixel are different from the porosity and the average aperture of the pores in the microcavity adjusting layer of the second sub-pixel.

Figure 1B:
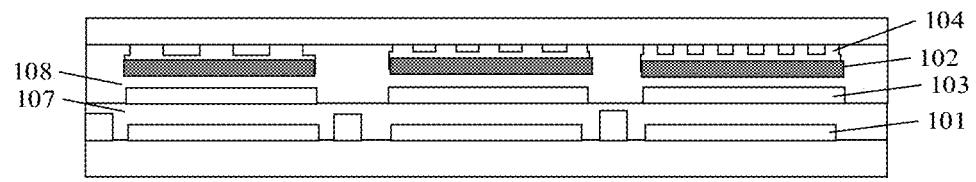
Figure 2A:
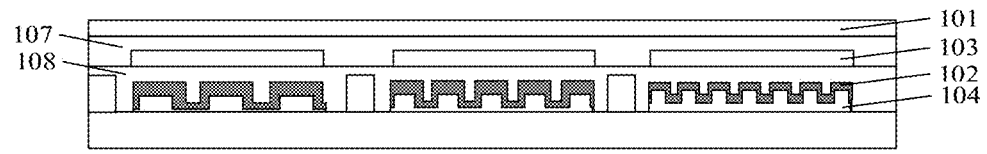
FIGS. 2A and 2B are second schematic diagrams of an organic light emitting diode device provided by an embodiment of the present disclosure.
Figure 2B:
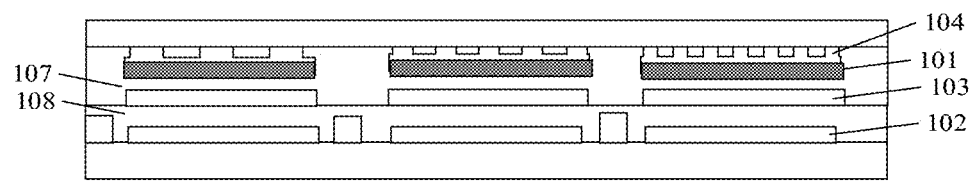

In the embodiment, as illustrated in FIG. 1A, the microcavity adjusting layer 104 can be formed on the side of the first electrode 101 that is far away from the light emitting layer 103; alternatively, as illustrated in FIG. 1B, the microcavity adjusting layer 104 can be formed on the side of the second electrode 102 that is far away from the light emitting layer 103. Alternatively, positions of the first electrode 101 and the second electrode 102 can be interchanged, which are illustrated in FIGS. 2A and 2B, and the specific positions of the first electrode 101 and the second electrode 102 are not limited in the embodiment.

In some examples of the embodiment, as illustrated in FIGS. 1A-2B, functional layers such as a hole injection layer, a hole transport layer and so on can be further provided between the first electrode 101 and the light emitting layer 103, that is, the position indicated by the, reference numeral 107; and functional layers such as an electron injection layer, an electron transport layer and so on can be further provided between the second electrode 102 and the light emitting layer 103, that is, the position indicated by the reference numeral 108.

In the embodiment, the first electrode can be, for example, an anode, and the second electrode can be, for example, a cathode. Alternatively, the first electrode can be, for example, the cathode, and the second electrode can be, for example, the anode. The embodiment is not limited in this aspect.

In the embodiment, the porosities and the average apertures of the pores in the microcavity adjusting layers 104 of different sub-pixels that generate light of different colors are different. For example, in the situation illustrated in FIG. 1A, the organic light emitting diode device shows three different sub-pixels, and porosities and average apertures of the pores in microcavity adjusting layers 104 of the three different sub-pixels are different from each other.

Figure 3:
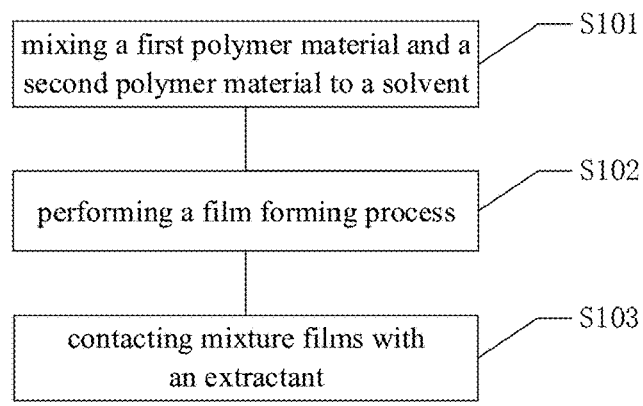
FIG. 3 is a flow diagram of a manufacture process of a microcavity adjusting layer provided by an embodiment of the present disclosure.

In the embodiment, as illustrated in FIG. 3, forming the microcavity adjusting layer can comprise, for example, steps S101 to S103.

Step S101: mixing a first polymer material and a second polymer material into a solvent.

In the embodiment, the microcavity adjusting layer 104 can be formed, for example, by a polymer material. The polymer material is selected, comprising at least two kinds of polymer materials, for example, comprising a first polymer material and a second polymer material. The first polymer material and the second polymer material are mixed to the solvent to form a mixture, and the solubility of the first polymer material in the solvent is greater than the solubility of the second polymer material in the solvent.

Step S102: performing a film forming process.

The film forming process is performed to the mixture obtained in the step S101 on a substrate to form a mixture film or mixture films. For example, the film forming process comprises a first heat process.

Figure 4A:
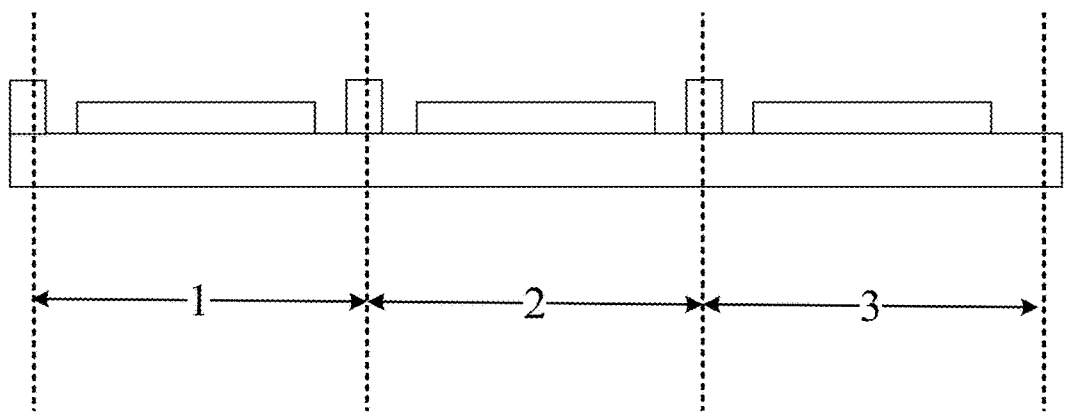
FIGS. 4A-4D are schematic diagrams of a microcavity adjusting layer in a manufacture process provided by an embodiment of the present disclosure.

In the embodiment, as illustrated in FIG. 4A, for example, the first polymer material and the second polymer material are mixed to the solvent and dissolved to form a mixture solution, and then a mixture solution layer is formed on a substrate by a method of spin coating, or a method such as scrape coating, curtain casting or the like. For example, the substrate can be a base substrate on which a transistor and a drive circuit are formed. In the embodiment, for example, the mixture solution can be spin-coated at a certain speed by a spin-coater at a desired position, for example, the speed of the spin-coater is set to be about 1000 rpm to 3000 rpm, for example, about 1500 rpm or 2000 rpm.

For example, after the mixture solution layer is formed, the first heat process can be performed on the mixture solution layer, the first heat process can allow the solvent in the mixture solution layer to volatilize, and during the volatilization of the solvent, the second polymer material having less solubility in the solvent is more easily to precipitate and agglomerate, and finally the precipitated second polymer material forms a continuous film; while the first polymer material having a greater solubility in the solvent is more soluble in the solvent, so the dispersion of the first polymer material is uniform, and during the volatilization of the solvent, the first polymer material precipitates later in the mixture film and the precipitation position is more dispersed or scattered, and finally the precipitated first polymer material is dispersed in a form of particles in the continuous film formed by the second polymer material. During the volatilization of the solvent, the precipitated first polymer particles tend to agglomerate with the lapse of time, and therefore sizes of the particles are increased while the amount of the particles is reduced.

For example, different first heat processes are performed on the mixture films in different sub-pixels, for example, different temperatures are performed in one first heat process, and therefore pores of different average apertures and porosities in the mixture films in different sub-pixels are formed.

Figure 4B:
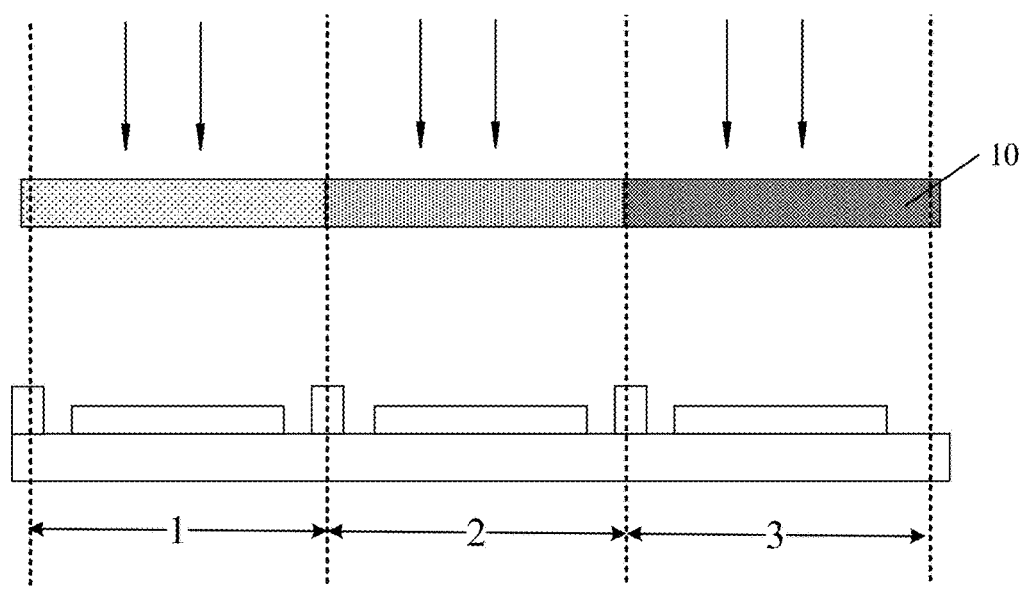

In the embodiment, as illustrated in FIG. 4B, the mixture films are distributed, for example, in three different sub-pixels, that is, a first sub-pixel 1, a second sub-pixel 2, and a third sub-pixel 3. In the embodiment, for example, the first heat process of different temperatures can be performed on the three different sub-pixels, the first heat process can accelerate the volatilization speed of the selected solvent, so that the first heat process of different temperatures can allow the volatilization rates of the solvent in the three sub-pixels to be different from each other, and therefore time periods required for the volatilization of the solvent in the three sub-pixels are different also. The higher the heating temperature, the faster the volatilization rate of the solvent, and the less time required for the volatilization of the solvent, and in the process of the volatilization of the solvent, the precipitated particles of the first polymer material having the greater solubility in the solvent are smaller, and the amount of precipitated particles of the first polymer material is greater, and finally the average aperture of the pores in the microcavity adjusting layer is smaller, and the porosity of the pores in the microcavity adjusting layer is greater. Therefore, in the embodiment, the average aperture and porosity of the pores in the microcavity adjusting layer can be adjusted by adjusting the heating temperatures of the different sub-pixels.

Step S103: contacting the mixture films with an extractant.

In the embodiment, the mixture films obtained in the step S102 are allowed to be sufficiently contacted with the extractant. The extractant has different solubility property for the first polymer material and the second polymer material for the purpose of forming pores. For example, the extractant is a good solvent (a solvent having a great solubility for a solute) for the first polymer material, while is a poor solvent (a solvent that difficultly dissolve or cannot dissolve a solute) for the second polymer material, so that the extractant can dissolve more of the first polymer particles in the mixture films to allow the pores to be formed at positions of the first polymer particles in the mixture films. Because the heating temperatures of the different sub-pixels are different, the sizes and amounts of the first polymer particles formed in the mixture films are different, and therefore the porosities and average apertures of the pores formed in the mixture films are different after the mixture films are sufficiently contacted with the extractant. The larger the heating temperature of the first heat process is, the smaller the average aperture and the greater the porosity of the pores finally formed are in the mixture films.

For example, after the first polymer particles are dissolved, a second heat process can be performed on the mixture films comprising pores to accelerate evaporation of the extractant to prevent the mixture films from being damaged because of long time immersion in the extractant. For example, the second heat process is a drying process for the mixture films. For example, a vacuum drying oven can be used in the drying process, and the finally obtained mixture films can be used as the microcavity adjusting layers.

In the embodiment, the first polymer material can be, for example, one selected from a group consisting of polystyrene, polymethyl methacrylate, polyvinylpyrrolidone, and polyimide; and the second polymer material can be, for example, another one selected from the group consisting of polystyrene, polymethyl methacrylate, polyvinylpyrrolidone, and polyimide. In this situation, the solvent is selected as a solvent which is able to dissolve both the first polymer material and the second polymer material, and a solubility of the first polymer in the solvent is greater than a solubility of the second polymer material in the solvent. The solvent is, for example, tetrahydrofuran, methyl ethyl ketone or the like. The extractant is selected as a good solvent for the first polymer material while a poor solvent for the second polymer material, and the extractant can be, for example, cyclohexane, cyclohexanone or the like. For example, where the first polymer material is polystyrene, the second polymer material is polymethyl methacrylate, the solvent can be tetrahydrofuran, and the extractant can be cyclohexane. For example, where the first polymer material is polymethyl methacrylate. the second polymer material is polystyrene, the solvent can be methyl ethyl ketone, and the extractant can be cyclohexanone.

In the embodiment, for example, irradiating of infrared light can be performed through a mask provided on or over the mixture films to perform the first heat process of different heating temperatures on different sub-pixels. For example, the mask used in the embodiment comprises regions of different transmittances respectively corresponding to mixture films in different sub-pixels, and therefore even if the mixture films are heated by a same infrared light source, for example, intensities of the infrared light emitted by the infrared light source passing through different regions of the mask change accordingly, so an intensity of the infrared light irradiated on the mixture film corresponding to a region of the mask having a high light transmittance is higher, and therefore the temperature of the first heat process performed on the mixture film is higher. Alternatively, for example, infrared light having different light intensities is irradiated for the same time period through masks whose opening positions correspond to different sub-pixels, so that a higher heating temperature is performed on the sub-pixel corresponding to the infrared light having a higher light intensity.

For example, in an example of the embodiment, the mixture films are correspondingly disposed in at least two different sub-pixels, such as a first sub-pixel and a second sub-pixel, and where the mixture films are used as the microcavity adjusting layers in the organic light emitting diode device after being processed, the two sub-pixels can emit light of different wavelengths, for example, the wavelength of light emitted by the first sub-pixel is greater than the wavelength of light emitted by the second sub-pixel. In this situation, where the first heat process is performed on the mixture films, the heating temperature of the first heat process performed on the first sub-pixel can be, for example, lower than the heating temperature of the first heat process performed on the second sub-pixel, and therefore the mixture film corresponding to the first sub-pixel is processed with a lower heating temperature in the first heat process, the volatilization speed of the solvent in the first sub-pixel are more slowly, and the time required for the volatilization of the solvent is longer, and finally the first polymer particles formed in the first sub-pixel are more easily to agglomerate, so that the average aperture of the pores formed in the mixture film in the first sub-pixel is larger and the porosity of the pores formed in the mixture film in the first sub-pixel is lower.

For example, as illustrated in FIG. 4B, the mixture films in the embodiment can be correspondingly disposed in three different sub-pixels, that is, the first sub-pixel 1, the second sub-pixel 2, and the third sub-pixel 3. The mixture films are used as the microcavity adjusting layers of the organic light emitting diode device after being processed, and wavelengths of light emitted by the three sub-pixels are sequentially decreased. In this situation, where the first heat process are performed on the mixture films, heating temperatures of the first heat process performed on the first sub-pixel 1, the second sub-pixel 2 and the third sub-pixel 3 are, for example, sequentially increased, so that volatilization rates of the solvent in the mixture films corresponding to the first sub-pixel 1, the second sub-pixel 2, and the third sub-pixel 3 are sequentially increased, and the time for the volatilization of the solvent is sequentially decreased. Therefore, average apertures of the pores formed in the mixture films corresponding to the first sub-pixel 1, the second sub-pixel 2, and the third sub-pixel 3 are sequentially decreased, and porosities of the pores formed in the mixture films corresponding to the first sub-pixel 1, the second sub-pixel 2, and the third sub-pixel 3 are sequentially increased.

In the embodiment, for example, same one infrared light source can be used to perform the first heat process of different temperatures on the mixture films in different sub-pixels through a patterned mask 10, as illustrated in FIG. 4B. Because the heating temperatures of the first heat process performed on the first sub-pixel 1, the second sub-pixel 2, and the third sub-pixel 3 are sequentially increased in the embodiment, light transmittances of regions of the patterned mask 10 in the embodiment corresponding to the first sub-pixel 1, the two sub-pixel 2 and the third sub-pixel 3 are sequentially increased. For example, the light transmittances of the regions of the patterned mask 10 corresponding to the first sub-pixel 1, the second sub-pixel 2, and the third sub-pixel are 30%, 50%, and 100%, respectively, and the temperature of the infrared light source is set to, for example, 60° C., and heating time is set to 2 hours, so that after the infrared light emitted by the infrared light source transmits through the mask 10, intensities of the transmitted infrared light corresponding to the first sub-pixel 1, the second sub-pixel 2, and the third sub-pixel 3 are sequentially increased, and therefore the heating temperatures of the first sub-pixel 1, the two sub-pixels 2 and the third sub-pixel 3 are sequentially increased, and the volatilization rates of the solvent in the mixture films of the first sub-pixel 1, the two sub-pixels 2 and the third sub-pixel 3 are sequentially increased, and the time required for the volatilization of the solvent are sequentially decreased, so that the average apertures of pores formed in the mixture films of the first sub-pixel 1, the second sub-pixel 2, and the third sub-pixel 3 are sequentially decreased, and the porosities of pores formed in the mixture films of the first sub-pixel 1, the second sub-pixel 2, and the third sub-pixel 3 are sequentially increased.

Figure 4C:
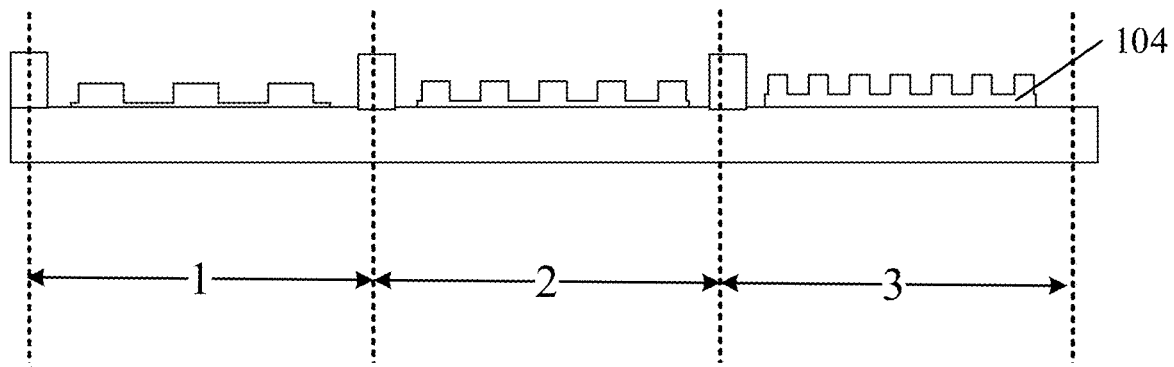

In the embodiment, the first sub-pixel 1, the second sub-pixel 2, and the third sub-pixel 3 can be, for example, a red sub-pixel, a green sub-pixel, and a blue sub-pixel, respectively. Therefore, heating temperatures of the first heat process performed on mixture films in the red sub-pixel, the green sub-pixel, and the blue sub-pixel are sequentially increased, and the heating temperatures can be controlled, for example, at about 20° C. to about 70° C. for the material selected above. For example, the heating temperatures of the red sub-pixel, the green sub-pixel, and the blue sub-pixel are about 30° C., 50° C. and 70° C., respectively, or 20° C., 40° C. and 60° C., respectively, etc., so that the average apertures of pores in the microcavity adjusting layers formed in the red sub-pixel, the green sub-pixel, and the blue sub-pixel are sequentially decreased, and the porosities of pores in the microcavity adjusting layers formed in the red sub-pixel, the green sub-pixel, and the blue sub-pixel are sequentially increased, as illustrated in FIG. 4C. For example, the average aperture of the pores in the microcavity adjusting layer of the red sub-pixel ranges from about 700 nm to about 1000 nm, such as 800 nm or 900 nm; the average aperture of the pores in the microcavity adjusting layer of the green sub-pixel ranges from about 300 nm to about 700 nm, such as 400 nm or 500 nm; and the average aperture of the pores in the microcavity adjusting layer of the blue sub-pixel ranges from about 100 nm to about 300 nm, such as 200 nm or 250 nm.

In the embodiment, for example, the mass ratio of the first polymer material or the second polymer material in the mixture film can be adjusted to adjust the porosity and the average aperture of the pores in the microcavity adjusting layer formed by the mixture film.

For example, the more the amount of the first polymer material having a higher solubility in the solvent, the larger the porosity of the pores in the microcavity adjusting layer formed by the mixture film, and the smaller the average aperture of the pores in the microcavity adjusting layer. In the embodiment, about mass percentage of the first polymer material having a higher solubility to the mixture of the first polymer material and the second polymer material can be, for example, about 40% to 70%, such as 50%, 60%, or the like. For example, where the first polymer material and the second polymer material are selected as polystyrene and polymethyl methacrylate, respectively, and the extractant is selected as tetrahydrofuran, which has a higher solubility for polystyrene while lower solubility for polymethyl methacrylate, about mass percentage of polystyrene in the mixture film can be, for example, about 40% to 70%, and the more the amount of polystyrene contained in the mixture film, the smaller the average aperture of the pores in the microcavity adjusting layer formed by the mixture film, and the larger the porosity of the pores in the microcavity adjusting layer formed by the mixture film.

For example, dissolution and dispersion of the first polymer material and the second polymer material in the mixture can also be controlled by controlling mixing conditions of the first polymer material, the second polymer material and the solvent, such as stirring rate, stirring temperature, and so on, so that the porosity and the average aperture of the pores in the formed microcavity adjusting layer are adjusted. For example, methods such as high speed stirring, ultrasonic agitation, or the like can be used to uniformly mix the first polymer material and the second polymer material.

In the embodiment, each of the microcavity adjusting layers of the organic light emitting diode device has a lower refractive index, and the microcavity adjusting layers of different average apertures and porosities have different refractive indexes. For example, in a sub-pixel, the first electrode is closer to the light exiting side of the organic light emitting diode, and the microcavity adjusting layer is on the side of the first electrode that is far away from the light emitting layer, and the refractive index of the microcavity adjusting layer can range, for example, from about 1.1 to about 1.7. For example, the refractive indexes of the microcavity adjusting layers in the red sub-pixel, the green sub-pixel, and the blue sub-pixel are 1.2, 1.3, or 1.4, respectively. The refractive index of the organic light emitting diode device can be adjusted. For example, the refractive index can be adjusted by controlling the average aperture and the porosity of pores in the microcavity adjusting layer, and therefore the microcavity effect generated by the organic light emitting diode device can be adjusted. Experiments show that, in a certain range, the refractive index of the organic light emitting diode device decreases with the increase of the porosity of pores in the microcavity adjusting layer, and the microcavity effect generated by the organic light emitting diode device increases with the decrease of the refractive index.

Figure 4D:
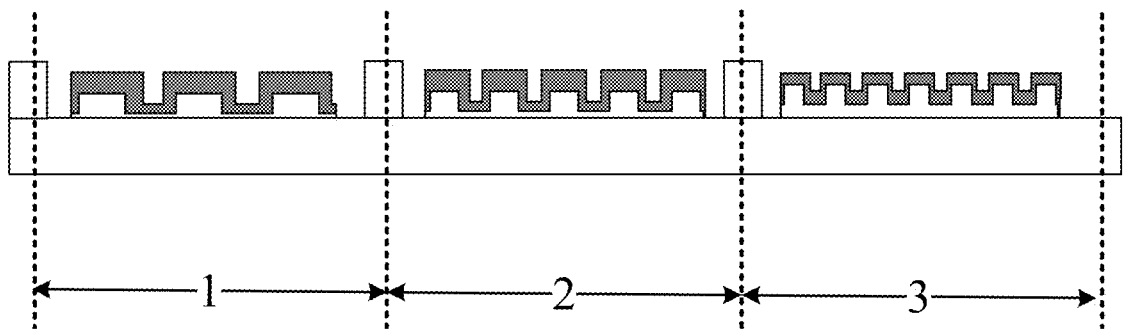

In the manufacture method of an organic light emitting diode device provided by the embodiment, after the microcavity adjusting layer is manufactured, as illustrated in FIG. 4D, the first electrode 101 or the second electrode 102 is formed on the microcavity adjusting layer 104, and then other structures, such as the light emitting layer 103 and so on are formed, which are not described in the embodiment.

The manufacture method of an organic light emitting diode device provided by the embodiment of the present disclosure can manufacture an organic light emitting diode device comprising the microcavity adjusting layers, and the method can adjust the average aperture and the porosity of the pores in the microcavity adjusting layers of different sub-pixels in the organic light emitting diode device, and therefore adjust the microcavity effect generated by different sub-pixels of the organic light emitting diode device, and finally achieve the technical effect of adjusting color saturation degrees of light of different colors emitted by different sub-pixels of the organic light emitting diode device. In addition, the manufacture process of the method provided by the embodiment is simple, the cost is low, and the method is suitable for mass production.

At least one embodiment of the present disclosure provides an organic light emitting diode device, the device is manufactured by the method of the above embodiment. The organic light emitting diode device includes microcavity adjusting layers comprising pores, and an average aperture and a porosity of the pores in each of the microcavity adjusting layers are adjusted, so that different sub-pixels of the organic light emitting diode device have microcavity adjusting layers of different average apertures and porosities can specifically adjust the microcavity effect generated by the different sub-pixels of the organic light emitting diode device, for example, adjust the microcavity effect generated by different sub-pixels that emit light of different colors of the organic light emitting diode device, and therefore adjust the color saturation degrees of different sub-pixels of the organic light emitting diode device.

For example, where the organic light emitting diode device comprises a red sub-pixel, a green sub-pixel, and a blue sub-pixel, and the microcavity adjusting layers comprising pores of different average apertures and porosities in different sub-pixels can respectively adjust color saturation degrees of light of red, green, and blue emitted by the organic light emitting diode device, so that the average apertures and porosities of the pores in the microcavity adjusting layers of the organic light emitting diode device can be adjusted according to color saturation degrees required for a specific application of the organic light emitting diode device. For example, where the organic light emitting diode device uses Adobe color gamut space, the green color saturation of the organic light emitting diode device should be higher, and the red color saturation can be lower, so that the average aperture of the pores in the microcavity adjusting layer of the green sub-pixel of the organic light emitting diode device can be increased to a certain extent, and the porosity of the pores in the microcavity adjusting layer of the green sub-pix can be decreased to a certain extent. In addition, the average aperture of the pores in the microcavity adjusting layer of the red sub-pixel of the organic light emitting diode device can be decreased to a certain extent, and the porosity of the pores in the microcavity adjusting layer of the red sub-pix can be increased to a certain extent, and therefore the microcavity effect generated by the green sub-pixel of the organic light emitting diode device can be strengthened, and the microcavity effect generated by the red sub-pixel of the organic light emitting diode device can be reduced, and ultimately the green color saturation of the organic light emitting diode device can be higher and the red color saturation can be lower. For example, where the organic light emitting diode device uses DCI (Digital Cinema Initiatives) gamut space, the red color saturation of the organic light emitting diode device should be higher, and the green color saturation can be lower, so that the average aperture of the pores in the microcavity adjusting layer of the red sub-pixel of the organic light emitting diode device can be increased to a certain extent, and the porosity of the pores in the microcavity adjusting layer of the red sub-pix can be decreased to a certain extent. In addition, the average aperture of the pores in the microcavity adjusting layer of the green sub-pixel of the organic light emitting diode device can be decreased to a certain extent, and the porosity of the pores in the microcavity adjusting layer of the green sub-pix can be increased to a certain extent, and therefore the microcavity effect generated by the red sub-pixel of the organic light emitting diode device can be strengthened, and the microcavity effect generated by the green sub-pixel of the organic light emitting diode device can be reduced, and ultimately the red color saturation of the organic light emitting diode device can be higher and the green color saturation can be lower.

At least one embodiment of the present disclosure provides an organic light emitting diode device, as illustrated in FIGS. 5A-6B, the device comprises a plurality of pixels, each pixel comprises at least two sub-pixels that emit light of different colors, and the sub-pixel comprises a first electrode 201, a second electrode 202 and a light emitting layer 203 between the first electrode 201 and the second electrode 202. Each of the sub-pixel further comprises a microcavity adjusting layer 204 on a side of the first electrode 201 that is far away from the light emitting layer 203. The microcavity adjusting layer 204 comprises pores, and average apertures and porosities of the pores in microcavity adjusting layers 204 of different sub-pixels that emit light of different colors are different. For example, the at least two sub-pixels that emit light of different colors comprise a first sub-pixel and a second sub-pixel, and the porosity and the average aperture of the microcavity adjusting layer of the first sub-pixel is different from the porosity and the average aperture of the microcavity adjusting layer of the second sub-pixel.

Figure 5A:
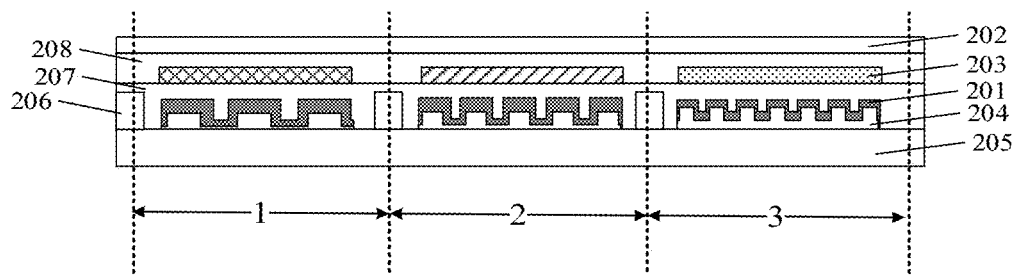
FIGS. 5A and 5B are third schematic diagrams of an organic light emitting diode device provided by an embodiment of the present disclosure.
Figure 5B:
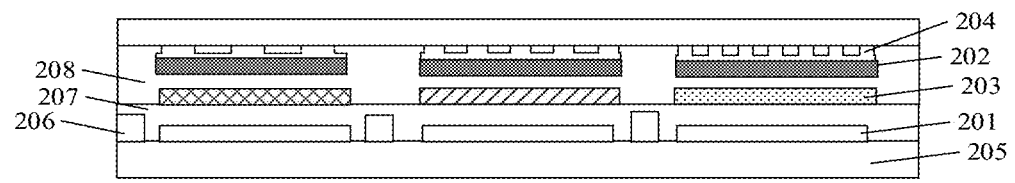
Figure 6A:
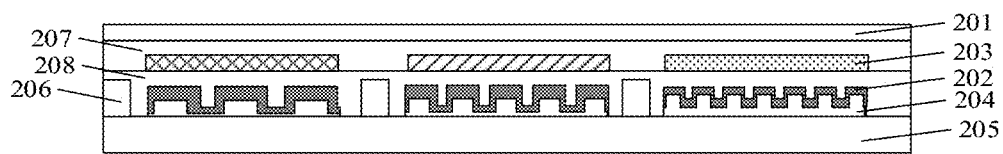
FIGS. 6A and 6B are fourth schematic diagrams of an organic light emitting diode device provided by an embodiment of the present disclosure.
Figure 6B:
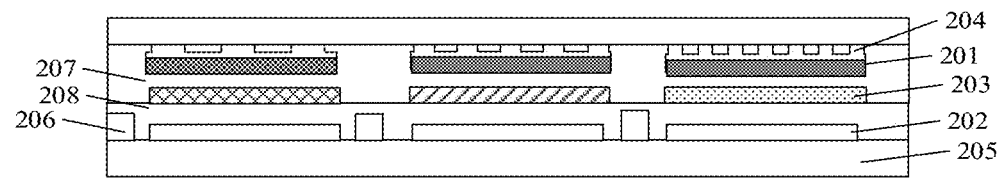

In the embodiment, as illustrated in FIG. 5A, the microcavity adjusting layer 204 can be on the side of the first electrode 201 that is far away from the light emitting layer 203, and the first electrode 201 can be, for example, an anode. In this situation, the surface of the microcavity adjusting layer comprising pores is in a convex-concave structure, which in turn causes the surface of the anode on the microcavity adjusting layer to be in a convex-concave structure, and therefore the micro-cavity reflecting surface with a certain roughness degree is formed. For example, micro-cavity reflecting surfaces with certain roughness degrees such as different average apertures and porosities are formed, so that the microcavity effect is adjusted in different sub-pixels. Alternatively, as illustrated in FIG. 5B, the microcavity adjusting layer 204 can be on a side of the second electrode 202 that is far away from the light emitting layer 203. For example, the second electrode 202 is a cathode. In this situation, in each sub-pixel, light emitted by the light emitting layer 203 sequentially transmits through the cathode and the microcavity adjusting layer to emit outside, the microcavity adjusting layer has a lower refractive index and the refractive index can be adjusted by adjusting the average aperture and porosity of the microcavity adjusting layer, and therefore the microcavity effect can be adjusted. In the embodiment, positions of the first electrode 201 and the second electrode 202 can be interchanged, as illustrated in FIGS. 6A and 6B, the specific positions of the first electrode 201 and the second electrode 202 are not limited in the embodiment.

In the embodiment, the average apertures and porosities of the pores in the microcavity adjusting layers formed in different sub-pixels of the organic light emitting diode device are different. For example, the organic light emitting diode device comprises at least two different sub-pixels, for example, comprise a first sub-pixel and a second sub-pixel, and a wavelength of light emitted by the first sub-pixel of the organic light emitting diode device is greater than a wavelength of light emitted by the second sub-pixel of the organic light emitting diode device. In this situation, an average aperture of pores in a microcavity adjusting layer of the first sub-pixel can be, for example, greater than an average aperture of pores in a microcavity adjusting layer of the second sub-pixel, and a porosity of the pores in the microcavity adjusting layer of the first sub-pixel can be, for example, lower than a porosity of the pores in the microcavity adjusting layer of the second sub-pixel.

For example, in the situation illustrated in FIG. 5A, the organic light emitting diode device comprises three different sub-pixels, that is, a first sub-pixel 1, a second sub-pixel 2, and a third sub-pixel 3, and average apertures and porosities of the pores in microcavity adjusting layers 104 formed in the three different sub-pixels are different. For example, where wavelengths of light emitted by the first sub-pixel 1, the second sub-pixel 2, and the third sub-pixel 3 of the organic light emitting diode device are sequentially decreased, the average apertures of the pores in the microcavity adjusting layers formed in the three sub-pixels can be, for example, sequentially decreased, and the porosities of the pores in the microcavity adjusting layers formed in the three sub-pixels can be, for example, sequentially increased.

In the embodiment, the first sub-pixel 1, the second sub-pixel 2, and the third sub-pixel 3 are a red sub-pixel, a green sub-pixel, and a blue sub-pixel, respectively, and average apertures of pores in microcavity adjusting layers of the red sub-pixel, the green sub-pixel, and the blue sub-pixel are sequentially decreased, and porosities of the microcavity adjusting layers of the red sub-pixel, the green sub-pixel, and the blue sub-pixel are sequentially increased. For example, the average aperture of the pores in the microcavity adjusting layer of the red sub-pixel ranges from about 700 nm to about 1000 nm, such as 800 nm or 900 nm; the average aperture of the pores in the microcavity adjusting layer of the green sub-pixel ranges from about 300 nm to about 700 nm, such as 400 nm or 500 nm; and the average aperture of the pores in the microcavity adjusting layer of the blue sub-pixel ranges from about 100 nm to about 300 nm, such as 200 nm or 250 nm. In a certain range, in a sub-pixel of the organic light emitting diode device, the microcavity adjusting layer comprising pores of a larger average aperture and a lower porosity, and the microcavity effect generated by the sub-pixel is stronger, and the color saturation of light emitted by the sub-pixel is higher.

In the embodiment, for example, the average apertures and porosities of the pores in the microcavity adjusting layers of different sub-pixels in the organic light emitting diode device can be adjusted according to color saturation degrees required for a specific application of the organic light emitting diode device. For example, where the application of an organic light emitting diode device requires higher red color saturation, the organic light emitting diode device comprising a red sub-pixel having a microcavity adjusting layer of a larger average aperture and a lower porosity can be selected. For example, an organic light emitting diode device comprising a red sub-pixel having a microcavity adjusting layer of an average aperture of about 900 nm is selected, and the red sub-pixel of the organic light emitting diode device can generate a strong microcavity effect when emitting light, so that the color saturation of the red light emitted by the device is higher. For example, where the application of an organic light emitting diode device requires higher green color saturation, the organic light emitting diode device comprising a green sub-pixel having a microcavity adjusting layer of a larger average aperture and a lower porosity can be selected. For example, an organic light emitting diode device comprising a green sub-pixel having a microcavity adjusting layer of an average aperture of about 600 nm is selected, and the green sub-pixel of the organic light emitting diode device can generate a strong microcavity effect when emitting light, so that the color saturation of the green light emitted by the device is higher. For example, where the application of an organic light emitting diode device requires higher blue color saturation, the organic light emitting diode device comprising a blue sub-pixel having a microcavity adjusting layer of a larger average aperture and a lower porosity can be selected. For example, an organic light emitting diode device comprising a blue sub-pixel having a microcavity adjusting layer of an average aperture of about 250 nm is selected, and the blue sub-pixel of the organic light emitting diode device can generate a strong microcavity effect when emitting light, so that the color saturation of the blue light emitted by the device is higher.

In the embodiment, the microcavity adjusting layer in the organic light emitting diode device may have a lower refractive index. The refractive index can be, for example, about 1.1 to about 1.7, such as 1.2, 1.3, 1.4, or the like. The refractive index of the organic light emitting diode device can be adjusted. For example, the refractive index can be adjusted by controlling the average aperture and the porosity of pores in the microcavity adjusting layer, and therefore the microcavity effect generated by the organic light emitting diode device can be adjusted. Experiments show that, in a certain range, the refractive index of the organic light emitting diode device decreases with the increase of the porosity and the decrease of the average aperture of pores in the microcavity adjusting layer, and the microcavity effect generated by the organic light emitting diode device increases with the decrease of the refractive index.

In the embodiment, the organic light emitting diode device can be, for example, a top emission type about or a bottom emission type organic light emitting diode device. The type of the organic light emitting diode device is not limited in the embodiment.

In the embodiment, as illustrated in FIGS. 5A, 5B, 6A, and 6B, the organic light emitting diode device can further comprise other structures such as a base substrate 205, a thin film transistor 206, a hole transport layer/hole injection layer 207, an electron transport layer/electron injection layer 208 and so on, which are not limited in the embodiment.

At least one embodiment of the present disclosure provides an organic light emitting diode display panel, the display panel comprises a plurality of pixels, and each of the pixels comprises any one of the above organic light emitting diode devices. The display panel can select organic light emitting diode devices having different microcavity adjusting layers according to applications, so that the light of various colors emitted by the display panel can have different color saturation degrees according to requirements.

The display panel can be used for any product or component having a display function, such as a mobile phone, a tablet computer, a television, a display, a notebook computer, a digital photo frame, a navigator, or the like.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a structure may be enlarged or reduced, that is, the drawings are not drawn according to an actual scales. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The above descriptions are only specific embodiments of the present disclosure, but the protection scope of the present disclosure is not limited thereto, those skilled in the art may make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. An organic light emitting diode device, comprising:
a plurality of pixels, wherein each of the pixels comprises at least two sub-pixels that are capable of generating light of different colors, and each of the sub-pixels comprises a first electrode, a second electrode, and a light emitting layer between the first electrode and the second electrode; and
each of the sub-pixels further comprises a microcavity adjusting layer comprising pores, the microcavity adjusting layer is on a side of the first electrode that is far away from the light emitting layer, and a porosity and an average aperture of the pores in the microcavity adjusting layer of each of the sub-pixels that are capable of generating light of different colors are different;
the at least two sub-pixels that are capable of generating light of different colors comprise a first sub-pixel, and a second sub-pixel a porosity and an average aperture of the pores in the microcavity adjusting layer of each of first sub-pixels of the pixels are substantially same, and a porosity and an average aperture of the pores in the microcavity adjusting layer of each of second sub-pixels of the pixels are substantially same;
a wavelength of light emitted by the first sub-pixel is greater than a wavelength of light emitted by the second sub-pixel,
an average aperture of pores in a microcavity adjusting layer of the first sub-pixel is greater than an average aperture of pores in a microcavity adjusting layer of the second sub-pixel, and
a porosity of the microcavity adjusting layer of the first sub-pixel is smaller than a porosity of the microcavity adjusting layer of the second sub-pixel.

2. The organic light emitting diode device according to claim 1, wherein the organic light emitting diode device is a top emission type organic light emitting diode device, and the first electrode is farther away from a light emitting side of the organic light emitting diode device than the second electrode.

3. The organic light emitting diode device according to claim 1, wherein the first electrode is closer to the light emitting side of the organic light emitting diode device than the second electrode, and a refractive index of the microcavity adjusting layer ranges from about 1.1 to about 1.7.

4. The organic light emitting diode device according to claim 2, wherein the at least two sub-pixels that are capable of generating light of different colors comprise three sub-pixels comprising a red sub-pixel, a green sub-pixel, and a blue sub-pixel,
average apertures of pores in microcavity adjusting layers of the red sub-pixel, the green sub-pixel, and the blue sub-pixel are sequentially decreased, and
porosities of the microcavity adjusting layers of the red sub-pixel, the green sub-pixel, and the blue sub-pixel are sequentially increased.

5. The organic light emitting diode device according to claim 4, wherein the average aperture of the pores in the microcavity adjusting layer of the red sub-pixel ranges from about 700 nm to about 1000 nm;
the average aperture of the pores in the microcavity adjusting layer of the green sub-pixel ranges from about 300 nm to about 700 nm; and
the average aperture of the pores in the microcavity adjusting layer of the blue sub-pixel ranges from about 100 nm to about 300 nm.

6. The organic light emitting diode device according to claim 1, wherein a material of the microcavity adjusting layer comprises one or two selected from a group consisting of polystyrene, polymethyl methacrylate, polyvinylpyrrolidone and polyimide.

7. A display panel, comprising the organic light emitting diode device according to claim 1.

8. The organic light emitting diode device according to claim 1, wherein the at least two sub-pixels that are capable of generating light of different colors comprise three sub-pixels comprising a red sub-pixel, a green sub-pixel, and a blue sub-pixel, average apertures of pores in microcavity adjusting layers of the red sub-pixel, the green sub-pixel, and the blue sub-pixel are sequentially decreased, and porosities of the microcavity adjusting layers of the red sub-pixel, the green sub-pixel, and the blue sub-pixel are sequentially increased.

9. A manufacture method of an organic light emitting diode device of claim 1, comprising:

forming a plurality of pixels, wherein each of the pixels comprises at least two sub-pixels that are capable of generating light of different colors, and each of the sub-pixels comprises a first electrode, a second electrode, and a light emitting layer between the first electrode and the second electrode; and forming a microcavity adjusting layer of each of the sub-pixels on a side of the first electrode that is far away from the light emitting layer, wherein the microcavity adjusting layer comprises pores, and a porosity and an average aperture of the pores in the microcavity adjusting layer of each of the sub-pixels that are capable of generating light of different colors are different.

10. The manufacture method of an organic light emitting diode device according to claim 9, wherein the at least two sub-pixels that are capable of generating light of different colors comprise a first sub-pixel and a second sub-pixel, and forming the microcavity adjusting layer comprising the pores comprises:

mixing a first polymer material and a second polymer material to a solvent to form a mixture, wherein a solubility of the first polymer material in the solvent is greater than a solubility of the second polymer material in the solvent;

performing a film forming process to the mixture on a substrate to form mixture films, wherein the film forming process comprises a first heat process; and contacting the mixture films with an extractant to form pores in the mixture films, and then performing a second heat process to evaporate the extractant, wherein the extractant is a good solvent for the first polymer while a poor solvent for the second polymer;

wherein heating temperatures of the first heat process performed on the first sub-pixel and the second sub-pixel are different to allow the porosities and the average apertures formed in the mixture films of the first sub-pixel and the second sub-pixel to be different after the mixture films are contacted with the extractant.

11. The manufacture method of an organic light emitting diode device according to claim 10, wherein irradiating of infrared light is performed through a mask having different transmittances respectively corresponding to the first sub-pixel and the second sub-pixel to allow the heating temperatures of the first heat process performed on the first sub-pixel and the second sub-pixel to be different.

12. The manufacture method of an organic light emitting diode device according to claim 10, wherein a wavelength of light emitted by the first sub-pixel is greater than a wavelength of light emitted by the second sub-pixel, and correspondingly, the heating temperature of the first heat process performed on the first sub-pixel is lower than the heating temperature of the first heat process performed on the second sub-pixel.

13. The manufacture method of an organic light emitting diode device according to claim 12, wherein the at least two sub-pixels that are capable of generating light of different colors comprise three sub-pixels comprising a red sub-pixel, a green sub-pixel, and a blue sub-pixel, and heating temperatures of the first heat process performed on the red sub-pixel, the green sub-pixel, and the blue sub-pixel to form the microcavity adjusting layers are sequentially increased.

14. The manufacture method of an organic light emitting diode device according to claim 10, wherein the first polymer material is one selected from a group consisting of polystyrene, polymethyl methacrylate, polyvinyl pyrrolidone and polyimide, and the second polymer material is another one selected from the group consisting of the polystyrene, polymethyl methacrylate, polyvinylpyrrolidone and polyimide.

* * * * *